(12) United States Patent
Siniaguine

(10) Patent No.: US 6,420,209 B1
(45) Date of Patent: Jul. 16, 2002

(54) INTEGRATED CIRCUITS AND METHODS FOR THEIR FABRICATION

(75) Inventor: Oleg Siniaguine, Santa Cruz, CA (US)

(73) Assignee: Tru-Si Technologies, Inc., Sunnyvale, CA (US)

( * ) Notice: Subject to any disclaimer, the term of this patent is extended or adjusted under 35 U.S.C. 154(b) by 0 days.

(21) Appl. No.: 09/538,869

(22) Filed: Mar. 29, 2000

Related U.S. Application Data

(62) Division of application No. 09/083,927, filed on May 22, 1998, which is a continuation of application No. PCT/US97/18979, filed on Oct. 27, 1997.
(60) Provisional application No. 60/030,425, filed on Oct. 29, 1996.

(51) Int. Cl.[7] .......................... H01L 21/44; H01L 21/48; H01L 21/50
(52) U.S. Cl. ......................................... 438/108; 438/15
(58) Field of Search .......................... 438/15, 107, 108, 438/109, 113, 114, 209, 455, 458, 974, 977, 187, 335, 462, 975

(56) References Cited

U.S. PATENT DOCUMENTS

| | | | |
|---|---|---|---|
| 3,739,463 A | 6/1973 | Aird et al. | 29/580 |
| 3,810,129 A | 5/1974 | Behman et al. | |
| 3,811,117 A | 5/1974 | Anderson, Jr. et al. | |
| 3,838,501 A | 10/1974 | Umbaugh | 29/583 |
| 3,881,884 A | 5/1975 | Cook et al. | |
| 3,991,296 A | 11/1976 | Kojima et al. | 219/121 L |

(List continued on next page.)

FOREIGN PATENT DOCUMENTS

| | | | |
|---|---|---|---|
| EP | 0 238 089 A2 | 3/1987 | H01L/25/08 |
| EP | 0 698 288 | 2/1996 | |
| EP | 0757431 A2 | 2/1997 | |
| WO | WO 92/03848 | 3/1992 | H01L/25/065 |

(List continued on next page.)

OTHER PUBLICATIONS

IPEC Precision brochure for PACEJET II (© 1996), 2 pages.
Siniaguine, O., et al., "Plasma Processing of Silicon Wafers at Atmospheric Pressure", *Electronic Industry*, Jun. 1994, pp. 27–30.

(List continued on next page.)

*Primary Examiner*—David Nelms
*Assistant Examiner*—Phuc T. Dang
(74) *Attorney, Agent, or Firm*—Skjerven Morrill LLP; Michael Shenker

(57) ABSTRACT

To fabricate back side contact pads that are suitable for use in a vertical integrated circuit, vias are made in the face side of a wafer, and dielectric and contact pad metal are deposited into the vias. Then the wafer back side is etched until the metal is exposed. When the etch exposes the insulator at the via bottoms, the insulator is etched slower than the wafer material (e.g. silicon). Therefore, when the dielectric is etched off and the metal is exposed, the dielectric protrudes down from the wafer back side around the exposed metal contact pads, by about 8 μm in some embodiments. The protruding dielectric portions improve insulation between the wafer and the contact pads when the contact pads are soldered to an underlying circuit. In some embodiments, before the contact pads are soldered, additional dielectric is grown on the wafer back side without covering the contact pads. In some embodiments, the wafer etch and the fabrication of the additional dielectric are performed one after another by a plasma process while the wafer is held in a non-contact wafer holder. In some embodiments, the wafer is diced and the dice are tested before the etch. The etch and the deposition of the additional dielectric are performed on good dice only. In some embodiments, the dice are not used for vertical integration.

7 Claims, 10 Drawing Sheets

U.S. PATENT DOCUMENTS

| | | |
|---|---|---|
| 3,993,917 A | 11/1976 | Kalter |
| 4,139,401 A | 2/1979 | McWilliams et al. ........ 148/175 |
| 4,141,135 A | 2/1979 | Henry et al. .................. 29/580 |
| 4,368,106 A | 1/1983 | Anthony |
| 4,394,712 A | 7/1983 | Anthony |
| 4,463,336 A | 7/1984 | Black et al. |
| 4,467,518 A | 8/1984 | Bansal et al. |
| 4,603,341 A | 7/1986 | Bertin et al. |
| 4,612,083 A | 9/1986 | Yasumoto et al. .......... 156/633 |
| 4,628,174 A | 12/1986 | Anthony |
| 4,722,130 A | 2/1988 | Kimura et al. ................ 29/413 |
| 4,729,971 A | 3/1988 | Coleman .................... 437/583 |
| 4,769,738 A | 9/1988 | Nakamura et al. |
| 4,807,021 A | 2/1989 | Okamura |
| 4,822,755 A | 4/1989 | Hawkins et al. ............ 437/227 |
| 4,842,699 A | 6/1989 | Hua et al. |
| 4,897,708 A | 1/1990 | Clements |
| 4,954,458 A | 9/1990 | Reid |
| 4,978,639 A | 12/1990 | Hua et al. .................... 437/230 |
| 4,996,587 A | 2/1991 | Hinrichsmeyer et al. |
| 5,024,970 A | 6/1991 | Mori .......................... 437/226 |
| 5,064,771 A | 11/1991 | Solomon ....................... 437/3 |
| 5,071,792 A | 12/1991 | Van Vonno et al. |
| 5,135,878 A | 8/1992 | Batur ........................... 437/39 |
| 5,160,987 A | 11/1992 | Pricer et al. |
| 5,166,097 A | 11/1992 | Tanielian |
| 5,191,405 A | 3/1993 | Tomita et al. |
| 5,225,771 A | 7/1993 | Leedy ..................... 324/158 P |
| 5,259,924 A * | 11/1993 | Mathews et al. ........... 156/653 |
| 5,268,326 A | 12/1993 | Lesk et al. .................... 437/62 |
| 5,270,261 A | 12/1993 | Bertin et al. |
| 5,307,942 A | 5/1994 | Quelfeter et al. |
| 5,309,318 A | 5/1994 | Beilstein, Jr. et al. |
| 5,313,097 A | 5/1994 | Haj-Ali-Ahmadi et al. |
| 5,314,844 A | 5/1994 | Imamura .................... 437/226 |
| 5,322,816 A | 6/1994 | Pinter ........................ 438/667 |
| 5,323,035 A | 6/1994 | Leedy ........................ 257/248 |
| 5,340,771 A | 8/1994 | Rostoker |
| 5,380,681 A | 1/1995 | Hsu |
| 5,399,898 A | 3/1995 | Rostoker |
| 5,414,637 A | 5/1995 | Bertin et al. |
| 5,426,566 A | 6/1995 | Beilstein, Jr. et al. |
| 5,453,404 A | 9/1995 | Leedy ........................ 437/203 |
| 5,463,246 A | 10/1995 | Matsunami |
| 5,466,634 A | 11/1995 | Beilstein, Jr. et al. |
| 5,467,305 A | 11/1995 | Bertin et al. |
| 5,468,663 A | 11/1995 | Bertin et al. |
| 5,472,914 A | 12/1995 | Martin et al. ............... 437/209 |
| 5,478,781 A | 12/1995 | Bertin et al. |
| 5,489,554 A | 2/1996 | Gates |
| 5,494,832 A | 2/1996 | Lehmann et al. |
| 5,502,333 A | 3/1996 | Bertin et al. |
| 5,502,667 A | 3/1996 | Bertin et al. |
| 5,504,036 A | 4/1996 | Dekker et al. .............. 437/183 |
| 5,506,753 A | 4/1996 | Bertin et al. |
| 5,517,057 A | 5/1996 | Beilstein, Jr. et al. |
| 5,517,754 A | 5/1996 | Beilstein, Jr. et al. |
| 5,532,519 A | 7/1996 | Bertin et al. |
| 5,550,942 A | 8/1996 | Sheem |
| 5,561,622 A | 10/1996 | Bertin et al. |
| 5,563,086 A | 10/1996 | Bertin et al. |
| 5,567,653 A | 10/1996 | Bertin et al. |
| 5,567,654 A | 10/1996 | Beilstein, Jr. et al. |
| 5,571,754 A | 11/1996 | Bertin et al. |
| 5,596,226 A | 1/1997 | Beilstein, Jr. et al. |
| 5,627,106 A | 5/1997 | Hsu ........................... 438/459 |
| 5,646,067 A | 7/1997 | Gaul .......................... 437/180 |
| 5,654,127 A | 8/1997 | Leedy ........................ 430/315 |
| 5,656,553 A * | 8/1997 | Leas et al. ..................... 438/15 |
| 5,691,248 A | 11/1997 | Cronin et al. ............... 437/227 |
| 5,707,485 A | 1/1998 | Rolfson et al. .......... 156/643.1 |
| 5,766,984 A * | 6/1998 | Ramm et al. ............... 438/109 |
| 5,824,595 A | 10/1998 | Igel et al. ................... 438/464 |
| 5,843,844 A | 12/1998 | Miyanaga ................... 438/694 |
| 5,846,879 A | 12/1998 | Winnerl et al. ............. 430/666 |
| 5,851,845 A * | 12/1998 | Wood et al. ................... 438/15 |
| 5,888,882 A | 3/1999 | Igel et al. ................... 438/460 |
| 5,888,883 A | 3/1999 | Sasaki et al. ............... 438/460 |
| 5,979,475 A | 11/1999 | Satoh et al. ................. 134/140 |
| 5,998,292 A | 12/1999 | Black et al. ................ 438/618 |
| 6,004,867 A | 12/1999 | Kim et al. .................. 438/459 |
| 6,083,811 A | 7/2000 | Riding et al. ............... 438/460 |
| 6,121,119 A | 9/2000 | Richards et al. ............ 438/462 |
| 6,162,701 A * | 12/2000 | Usami et al. ............... 438/455 |
| 6,176,966 B1 | 1/2001 | Tsujimoto et al. .......... 156/344 |
| 6,184,060 B1 | 2/2001 | Siniaguine .................. 438/106 |

FOREIGN PATENT DOCUMENTS

| | | | |
|---|---|---|---|
| WO | WO 94/09513 | 4/1994 | .......... H01L/23/48 |
| WO | WO 94/25981 | 11/1994 | |
| WO | WO 96/21943 | 7/1996 | |
| WO | WO 97/18979 | 5/1997 | .......... B60T/13/00 |
| WO | WO 97/45856 | 12/1997 | |
| WO | WO 97/45862 | 12/1997 | |
| WO | WO 98/19337 | 5/1998 | .......... H01L/21/44 |

OTHER PUBLICATIONS

Siniaguine, Oleg, "Plasma Jet Etching at Atmospheric Pressure for Semiconductor Production", First Int'l Symposium on Plasma Process–Induced Damage, May 13–14, 1996, Santa Clara, CA, pp. 151–153.

AZ Corporation, "Plasma Jet Etching Technology and Equipment; Silicon Wafer Thinning & Isotropical Etching at Atmospheric Pressure", Semicon/Europe, Apr. 1995, Geneva, Switzerland, 4 pages.

Christensen, C., et al., "Wafer Through–Hole Interconnections with High Vertical Wiring Densities", *IEEE Trans. on Comp., Pkg., & Mfg. Tech*, Part A, vol. 19, No. 4, Dec. 1996, pp. 516–521.

Anthony, T., "Forming Feedthroughs in Laser–Drilled Holes in Semiconductor Wafers by Double–Sided Sputtering", *IEEE Trans. on Comp., Hybrids, & Mfg. Tech*, vol. CHMT–5, No. 1, Mar. 1982, pp. 171–180.

* cited by examiner

INTEGRATED CIRCUITS AND METHODS FOR THEIR FABRICATION

CROSS-REFERENCE TO RELATED APPLICATIONS

The present application is a division of U.S. patent application Ser. No. 09/083,927 filed May 22, 1998, now U.S. Pat. No. 6,184,060 issued Feb. 6, 2001, incorporated herein by reference, which is a continuation of international application PCT/US97/18979, with an international filing date of Oct. 27, 1997, which is incorporated herein by reference. The international application PCT/US97/18979 claims priority of U.S. provisional application No. 60/030,425 filed Oct. 29, 1996.

BACKGROUND OF THE INVENTION

The present invention relates to integrated circuits, and more particularly to chip interconnection and to forming contact pads on the back side of a semiconductor chip, and also to thinning of integrated circuits after circuit elements have been fabricated.

Some techniques for forming contacts on the chip "second" side are disclosed in U.S. Pat. No. 5,270,261 issued Dec. 14, 1993 to Bertin et al. and entitled "Three Dimensional Multichip Package Methods of Fabrication". Alternative techniques are desired.

SUMMARY

The invention provides methods for making backside contact pads in a semiconductor die (or "chip"). The back-side contact pads are suitable for connecting the die to an underlying die to form a multi-die vertical integrated circuit. The invention also provides vertical integrated circuits. In addition, the invention provides methods for thinning of individual dice whether or not the dice will be part of a vertical integrated circuit.

In some embodiments of the present invention, back-side contact pads are formed as follows. A masked etch of the face side of a semiconductor wafer creates a via over each location where a back-side contact pad is to be formed. A dielectric is deposited over the via, and a conductive layer (for example, metal) is deposited over the dielectric. The bottom portion of the conductive layer in each via will form the back-side contact pad.

After the integrated circuit has been formed, the wafer is etched from the back side until the back-side contact pad is exposed. The etch etches the wafer substrate faster than it etches the dielectric separating the substrate from the pad. Therefore, the wafer substrate is receded relative to the dielectric so that the dielectric protrudes down relative to the substrate around each back-side contact pad. Thus the dielectric insulates the back-side contact pads from the substrate.

In some embodiments, the wafer is held by a non-contact wafer holder during the back-side etch. The face side of the wafer does not physically contact the holder. Therefore, there is no need to cover the face side with any protective layer to protect the wafer during the etch. Further, the holder protects the face side circuitry from the etch.

The wafer is diced into dice before or after the back-side etch.

In some embodiments, the back-side contact pads are used for vertical integration.

In some embodiments, the dice are not used for vertical integration. The dice are thinned to reduce their vertical dimension.

Other embodiments and variations are within the scope of the invention.

DESCRIPTION OF PREFERRED EMBODIMENTS

Figure 1:
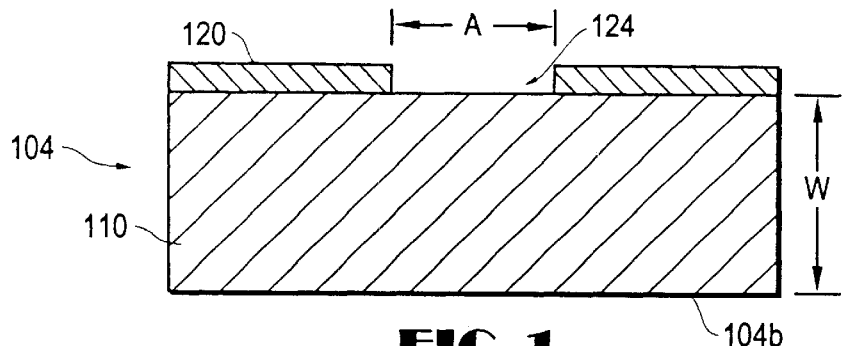
FIGS. 1–7, 8A and 8B are cross section illustrations of a semiconductor wafer in the process of fabrication of a back-side contact pad.

FIG. 1 shows a wafer 104 a portion of which will provide a die having an integrated circuit with back-side contact pads. The back-side contact pads are suitable for connecting the die to an underlying die to create a "vertical integrated circuit". The two dice will be stacked on top of each other, reducing the lateral area taken by the circuit.

Wafer 104 includes silicon substrate 110. In some embodiments, the wafer has been processed to form transistors, capacitors, resistors, conductive lines, and/or other circuit elements, or portions of circuit elements, in, above and/or below substrate 110. In other embodiments, no portions of any circuit elements have been formed. The wafer thickness is greater than the thickness of the die to be manufactured. In some embodiments, wafer 104 is 600–750 $\mu$m thick (dimension W is 600–750 $\mu$m). When the integrated circuit fabrication will be completed, the wafer will be thinned by an etch of the wafer back side 104B. The final thickness of the die will be 100–350 $\mu$m or less in some embodiments. Other thicknesses are achieved in other embodiments. Providing a greater wafer thickness at the beginning of fabrication makes the wafer stronger and thus increases the manufacturing yield.

Figure 2:
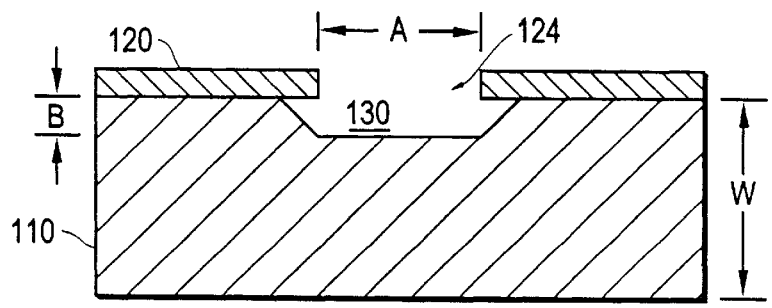
Figure 3:
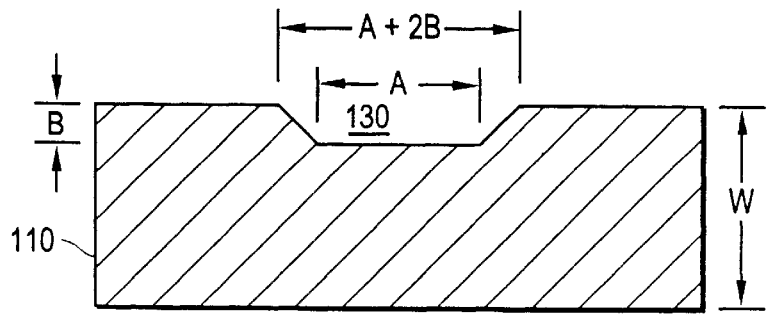

FIGS. 1–3 show an etch of silicon substrate 110 on the wafer face side to form vias in which the back-side contact pads will be fabricated. As shown in FIG. 1, an aluminum layer 120 is deposited on silicon 110. In some embodiments, the aluminum layer is 0.8–1.2 $\mu$m thick, 1 $\mu$m thick in some embodiments. Other thicknesses are used in other embodiments. Photoresist (not shown) is deposited and patterned. The aluminum 120 is etched to form an opening 124 exposing the silicon 110. In some embodiments, aluminum 120 is etched by an acid dip. In other embodiments, aluminum 120 is etched by a Cl-based vacuum plasma etch described in "VLSI Electronic Microstructure Science", the volume "Plasma Processing for VLSI" (edited by Norman G. Einspruch, Academic Press, Inc. 1984), hereby incorporated herein by reference. Other aluminum etches are used in other embodiments.

The width of opening 124 is shown as A. In some embodiments, opening 124 is round of a diameter A. In other embodiments, the opening is a square having a side A. Other opening shapes are used in other embodiments. The center of the opening is located directly above the center of the corresponding back-side contact. The opening dimensions are not greater than the dimensions of the back-side contact pad to be formed under the opening.

Other openings similar to opening 124 are formed simultaneously at the location of each back-side contact pad. Different openings may have different shapes and dimensions in the same wafer.

The photoresist is stripped, and silicon 110 is etched with aluminum 120 as a mask (FIG. 2). In some embodiments, the silicon etch is an isotropic vacuum plasma etch described in the aforementioned volume "Plasma Processing for VLSI". Other known etches are used in other embodiments. The etch forms vias 130 of a depth B at the location of each back-side contact pad. Only one via 130 is shown in FIGS. 2 and 3. The via depth B is at least as large as the final thickness of the die to be manufactured. In some embodiments, the bottom side of via 130 has the same shape and dimensions as the corresponding opening 124 in aluminum 120. The via widens as it goes up. As shown in FIG. 3, in some isotropic etch embodiments the dimensions of the top of via 130 are larger by 2B than the respective dimensions of the bottom of the via. In other embodiments, the top dimension is A+2C, where C>0, e.g. 0<C<B. If the etch is a perfectly anisotropic vertical etch (e.g. the horizontal etch rate is zero; this holds true for some known reactive ion etches), then C=0.

Aluminum 120 is removed by an acid dip or another method known in the art (FIG. 3).

In some embodiments, the mask used in the etch of vias 130 is made of a photoresist; aluminum is not used for the mask. However, in some embodiments in which the via depth B exceeds 20 $\mu$m, the mask is formed from aluminum or another material sufficiently resistant to the silicon etch of vias 130.

Figure 4:
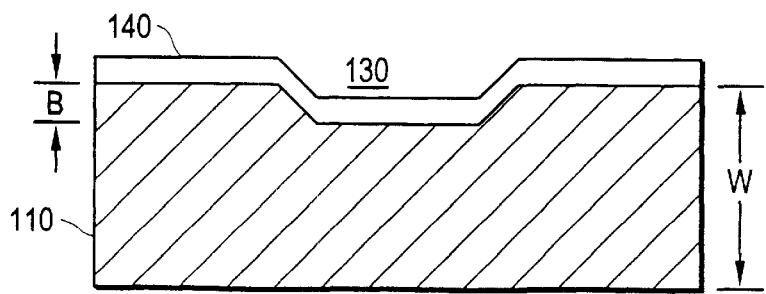

A dielectric layer 140 (FIG. 4) is deposited over the wafer. In some embodiments, layer 140 is undoped silicon dioxide and/or BPSG, 1–2 $\mu$m thick, e.g. 1 $\mu$m thick. Other materials or thicknesses are used in other embodiments. In FIG. 4, layer 140 is BPSG formed by chemical vapor deposition at the atmospheric pressure. The distance between the top of silicon 110 and the bottom of vias 130 remains equal to B. Other deposition techniques, including thermal oxidation, are used in other embodiments.

A conductive layer 150 (FIG. 5) is deposited over dielectric 140. In some embodiments, layer 150 is a 0.8–1.2 $\mu$m (e.g. 1 $\mu$m) layer of aluminum, gold, or nickel; these metals can be deposited by vacuum sputtering. In other embodiments, layer 150 is some other metal or alloy used in VLSI for contact pads, for example, aluminum doped with silicon or copper or both. The thickness of layer 150 in one Al/Si/Cu embodiment is 0.8–1.2 $\mu$m. The bottom portions 150C of layer 150 in vias 130 will provide the back-side contact pads.

The bottom portions 150C in vias 130 have about the same dimensions (such as A) as the respective openings 124 (FIG. 1).

Figure 6:
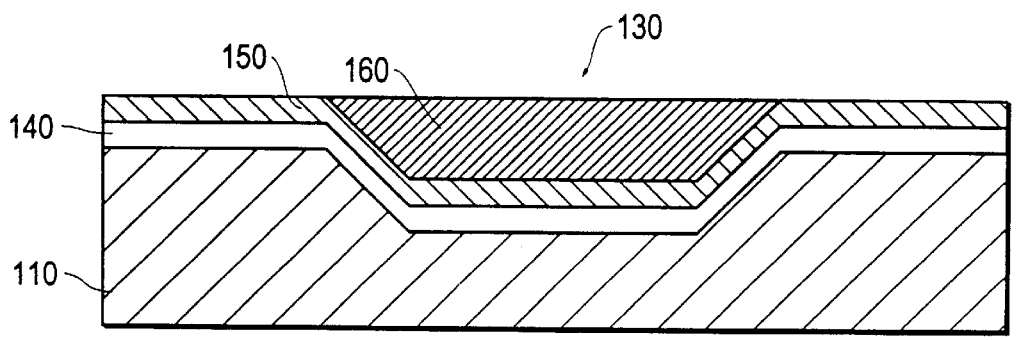

A silicon dioxide glass layer 160 (FIG. 6) is deposited from TEOS and is spun on the wafer to fill the vias 130. Oxide 160 has a planar top surface. In some embodiments, no voids are left in the vias. Excess oxide 160 is etched off the wafer by a blanket etch so that the oxide remains in vias 130 but not outside the vias and the top surface of the wafer is planar.

Other materials and processes are used to fill vias 130 in other embodiments.

Conductive layer 150 is patterned by standard photolithographic techniques to form conductive lines (not shown) connecting the back-side contact pads 150C in vias 130 to integrated circuit elements (formation of these elements may not yet be completed at this point).

Figure 5:
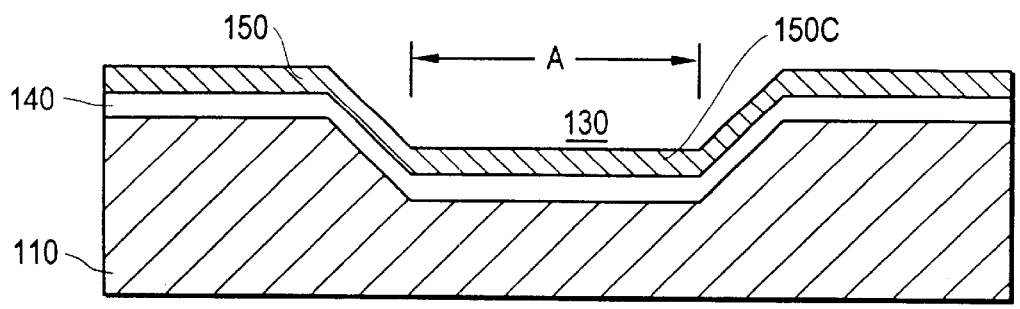

In some embodiments, layer 150 is patterned at the stage of FIG. 5 before the deposition of oxide 160 rather than after the deposition of oxide 160. The photoresist mask (not shown) used to pattern metal 150 protects the metal inside vias 130. After the patterning, the mask is removed, and spin-on glass 160 is deposited from TEOS. Glass 160 is used to planarize the wafer.

Figure 7:
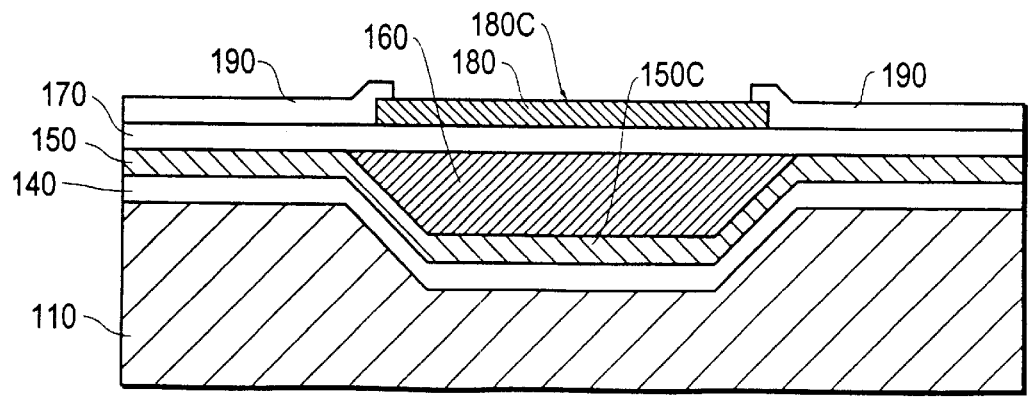

Then steps are performed to complete fabrication of the integrated circuit, forming other circuit elements and, in particular, face side contact pads. In the embodiment of FIG. 7, these steps include:

1. Chemical vapor deposition of a dielectric layer 170 (silicon dioxide, undoped and/or BPSG, 1 $\mu$m thick). Layer 170 is patterned if needed for circuit fabrication.

2. Deposition of the last metal layer 180 (e.g. 0.8–1.2 $\mu$m of Al/Si) over dielectric 170. Metal 180 is patterned to provide face side contact pads. In the embodiment of FIG. 7, one such pad 180C overlies a back-side pad 150C.

3. Deposition of protective dielectric 190 (such as undoped silicon dioxide and/or BPSG, 1 $\mu$m thick) over layer 180.

4. Masked etch of dielectric 190 to expose the underlying contact pads in metal 180.

Figure 16:
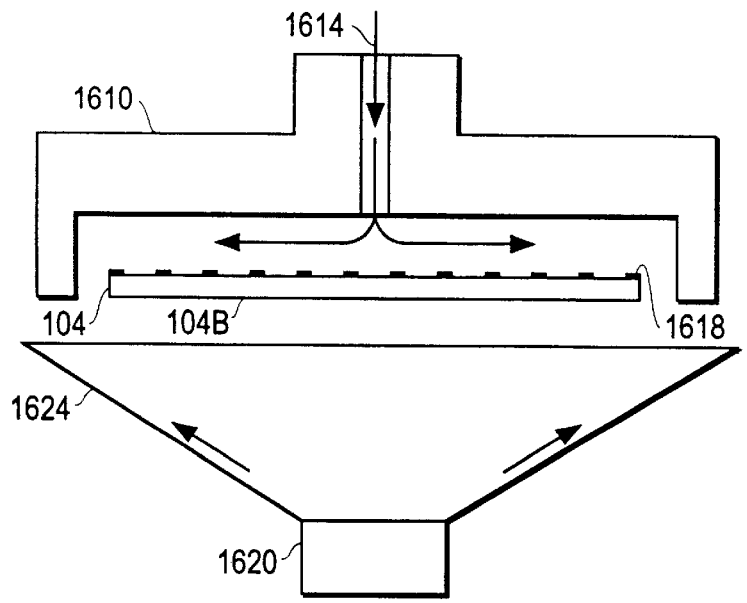
FIG. 16 illustrates the process and apparatus for thinning a semiconductor wafer by a back-side etch.

Then the wafer 104 back side is etched by an atmospheric pressure plasma etch described in O. Siniaguine, "Plasma Jet Etching at Atmospheric Pressure for Semiconductor Production", 1996 1st International Symposium on Plasma Process-Induced Damage, May 13–14, 1996, California, U.S.A., pages 151–153 hereby incorporated herein by reference. A suitable etcher is the plasma etcher of type "PLASM-AZ-05" described in "Plasma Jet Etching. Technology and Equipment. Silicon Wafer Thinning & Isotropical Etching at Atmospheric Pressure" (Az Corporation, Geneva, Switzerland, SEMICON/EUROPA '95), April 1995. See also the following PCT publications incorporated herein by reference: WO 96/21943 published Jul. 18, 1996; WO 92/12610 published Jul. 23, 1992; WO 92/12273 published Jul. 23, 1992. The plasma is a fluorine containing plasma maintained at the atmospheric pressure. The etch parameters are as follows: Ar (1 slm)+CF4 (3 slm) plasma in air ambient at atmospheric pressure. ("Slm" stands for standard liters per minute.) The DC power is 12 kW. The wafer temperature is about 300° C. The silicon etch rate is about 10 $\mu$m/min for an 8-inch wafer. Thus, a wafer can be etched from a 720 $\mu$m thickness down to 120 $\mu$m in 1 hour. Alternatively, 1.6 wafers per hour can be etched from 720 $\mu$m down to 360 $\mu$m. The etch is illustrated in FIG. 16 described below.

This etch etches BPSG 140 about 10 times slower than silicon.

The etch does not etch the aluminum, gold or nickel in layer 150.

Figure 8A:
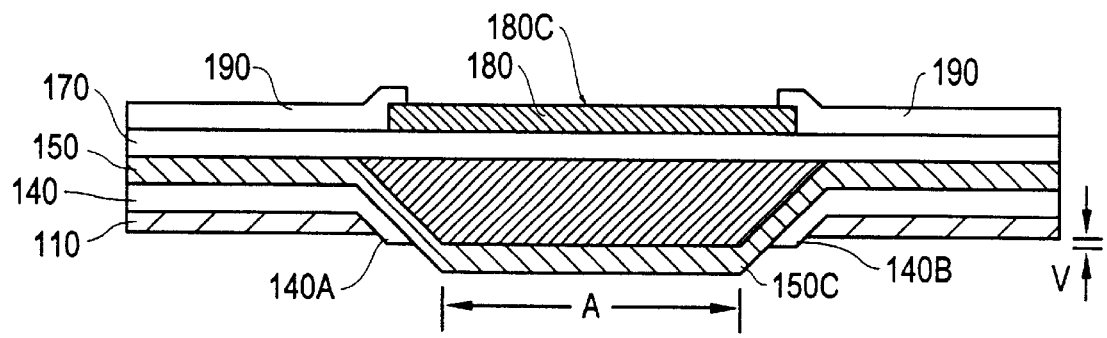

The resulting structure is shown in FIG. 8A. When silicon dioxide 140 becomes exposed during the back-side etch, the etch etches silicon dioxide 140 about 8–10 times slower than silicon 110. Therefore, when the silicon dioxide is etched off the back-side contact pads 150C, the bottom portions 140A, 140B of the silicon dioxide around the metal 150 protrude down further than silicon 110. These protruding portions 140A, 140B help insulate the silicon substrate 110 from metal 150. In some embodiments in which the oxide 140 is 1 $\mu$m thick, 10 $\mu$m of silicon is etched during the time during which 1 µm of oxide 140 is etched off the back-side contact pads 150C. Thus, the vertical dimension V of protruding oxide portions 140A, 140B is 8–10 µm (at least 9 µm in some embodiments), which is sufficient to insulate the back-side contact pads 150C from the silicon substrate in some embodiments.

In some embodiments, oxide 140 is thicker, and the vertical dimension V of the protruding portions 140A, 140B left after exposing the contact pads 150C is larger.

In some embodiments, the plasma processing continues to grow a dielectric layer 192 (FIG. 8B) on the wafer backside. In particular, when the etch has been completed, the fluorine containing gas (for example, $CF_4$) is turned off in the plasma reactor. Oxygen (or water vapor), or nitrogen, or both oxygen and nitrogen (for example, air), are supplied with the plasma. The oxygen and/or nitrogen react with silicon 110 to form silicon oxide (SiO or $SiO_2$), silicon nitride $SiN_x$ (for example, $Si_3N_4$), and/or oxy-nitride $SiO_xN_y$.

In some embodiments, dielectric 192 is 0.01–0.02 µm thick to provide reliable electrical isolation in a packaged vertical integrated circuit powered by supply voltages below 5V.

Figure 8B:
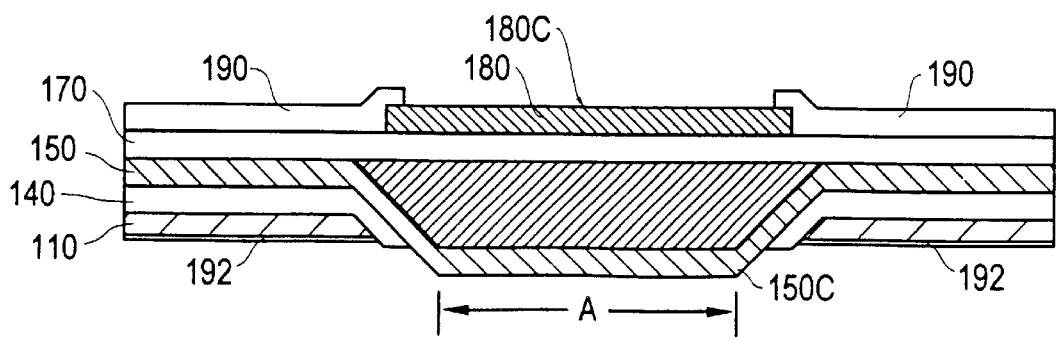

In some embodiments of FIG. 8B, insulator 192 is grown at a wafer temperature of 300–500° C. The concentration of oxygen and/or nitrogen is 20–80%. In some embodiments using oxygen without nitrogen, the processing time is about 10 minutes to grow silicon oxide of a 0.02 µm thickness. The thickness of layer 192 can be increased by using higher wafer temperature, higher oxygen and/or nitrogen concentration, or longer processing time.

In embodiments having the layer 192, metal 150 is chosen so as not to form a non-conductive layer on its bottom surface during the layer 192 fabrication. Thus, in some embodiments, metal 150 is gold, platinum, or some other metal that does not react with the species (oxygen or nitrogen) used to form layer 192. In other embodiments, metal 150 is titanium, or some other metal, that forms a conductive layer (for example, TiN) When the dielectric 192 is grown. In still other embodiments, metal 150 is a stack of metal layers such that the bottom layer of the stack does not form a non-conductive material on its surface. For example, in some embodiments, the bottom layer is gold, platinum or titanium, and an overlying layer is aluminum.

Steps of fabrication of the integrated circuit elements can be intermixed with the back-side contact pad fabrication steps of FIGS. 1–7, 8A, 8B in any suitable manner.

Figure 9:
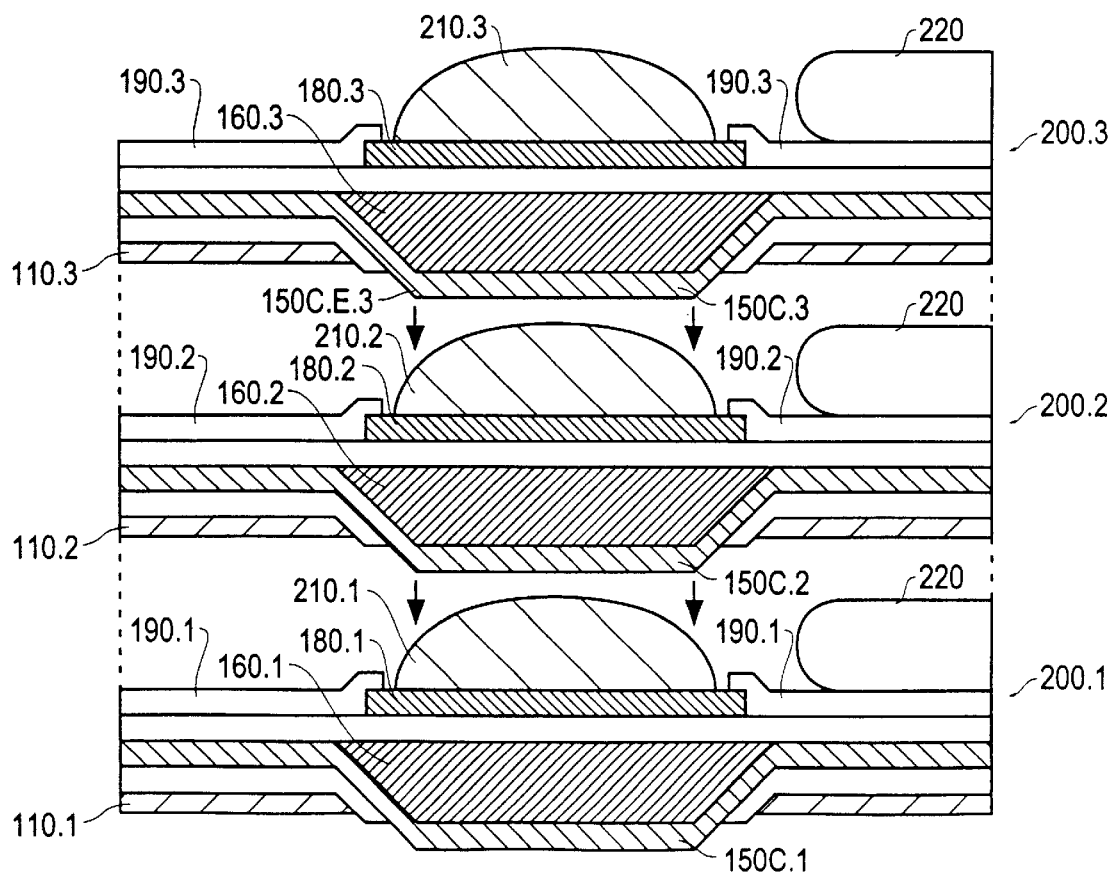
FIGS. 9 and 10 show three dice having back-side contact pads of FIG. 8A; the dice are being connected together in a vertical integrated circuit.
Figure 10:
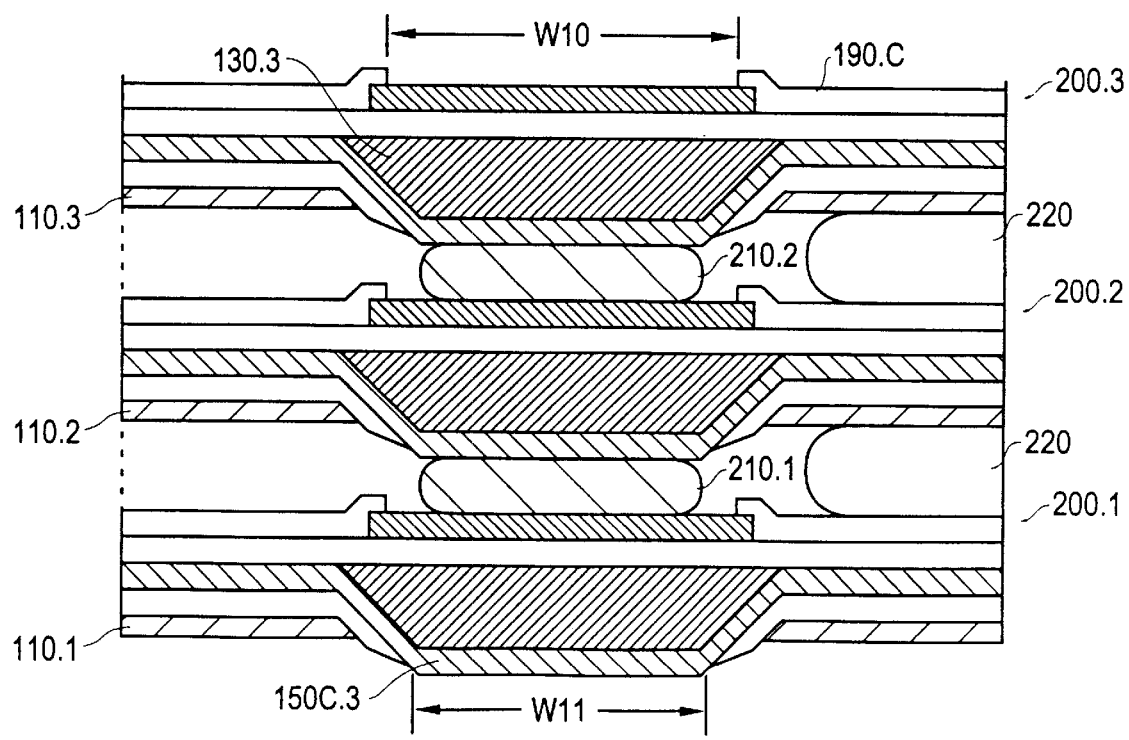

Then wafer 104 is diced into dice. FIGS. 9–10 show vertical interconnection of three dice 200.1, 200.2, 200.3 which have been obtained from wafers processed as in FIGS. 1–7, 8A, and possibly 8B (layer 192 is not shown in FIGS. 9–10 but is present in some embodiments). Different dice 200 may contain different integrated circuits and may be obtained from different wafers 104. Suffix ".i" (i=1, 2, 3) in reference numerals in FIGS. 9–10 indicates correspondence to the same numeral of FIGS. 1–7, 8A, 8B in die 200.i. For example, 150C.3 denotes a back-side contact pad in die 200.3.

After the wafers are diced, a solder ball 210.i (FIG. 9) is placed by a robot over each face-side contact pad in metal 180.i. Solder 210 has a lower melting temperature than metal 150 or any other metal possibly present in the dice. In some embodiments, solder 210.i is made of tin, lead or their alloys. In some embodiments, the solder melting temperature is 120–180 degrees Celsius.

Some embodiments use conductive epoxy or conductive polymer instead of solder.

The dice are aligned so that each back-side contact pad 150C which is to be connected to an underlying die is positioned over the respective solder ball 210 in the underlying die. For example, contact pad 150C.3 is positioned over solder ball 210.2. In some embodiments, other dice (not shown) overly die 200.3 and underlie die 200.1. The dice are pressed together and heated. The heating temperature is sufficient to melt or soften the solder 210. The heating temperature is 120 to 180 degrees C. in some embodiments. The pressure is sufficient to create a good electrical contact between face-side pads in metal 180 and the overlying back-side pads 150C. The force applied to press the wafers together is 100–200 grams in some embodiments.

The dimensions of the solder 210 and the openings in dielectric 190 that expose the face-side contact pads in metal 180 are chosen so that the melted solder does not reach the lateral edges of the back-side contact pads 150C. For example, the melted solder 210.2 does not reach the edge 150C.E.3 of contact pad 150C.3. The melted solder in contact with the corresponding back-side contact pad 150C is held at the center of the back-side contact pad by the surface tension force acting at the interface between the solder and the pad. As a result, solder 210 does not contact the silicon 110 of the overlying wafer. The protruding portions 140A, 140B (FIG. 8A) increase the distance between the exposed metal 150 and the silicon 110. Since the solder adheres to the metal but not to the oxide 140, the protruding portions 140A, 140B help to prevent the solder 210 from contacting the silicon 110. In the embodiments using dielectric 192 (FIG. 8B), the dielectric 192 provides additional protection against silicon 110 contacting the solder.

Then the structure is cooled. The dice remain connected together in a vertical integrated circuit.

To strengthen the structure, the structure is placed in a vacuum chamber, and a dielectric adhesive 220 is introduced between the dice 200 by methods known in the art. The adhesive fills the spaces between the contacts formed by solder 210.

FIG. 10 shows the structure with back-side contact pads 150C seated on solder 210. In some embodiments, the width W10 of each of the openings in dielectric 190 that expose the face-side contact pads is 50 to 100 µm. In some embodiments, each opening is round, and the opening width is the opening diameter. In other embodiments, the opening is square, and its width is its side length. The width W11 of each back-side contact pad 150C is 30–50 µm. The width is the diameter or the side length, as described above for the openings in dielectric 190. The distance D10 between the bottom surfaces of silicon substrates 110 of adjacent dice is below 50 µm. The aspect ratio of each via 130 is below 2:1 in some embodiments, and is about 1:1 in some embodiments. The low aspect ratio increases the yield. The large width of openings in dielectric 190 and of contact pads 150C, and hence the large area of solder connections, improves heat dissipation when local heating occurs.

The multi-die structure is then encapsulated into a plastic or ceramic package, or some other package, using methods known in the art.

Figure 11:
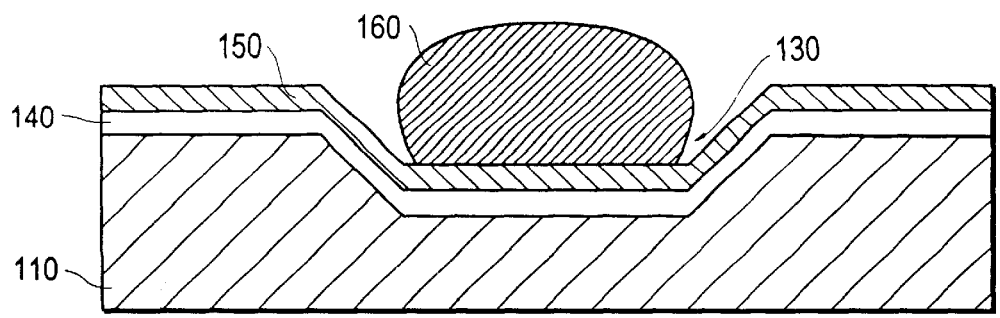
FIGS. 11–13 are cross-section illustrations of a semiconductor wafer in the process of creating a back-side contact pad.
Figure 12:
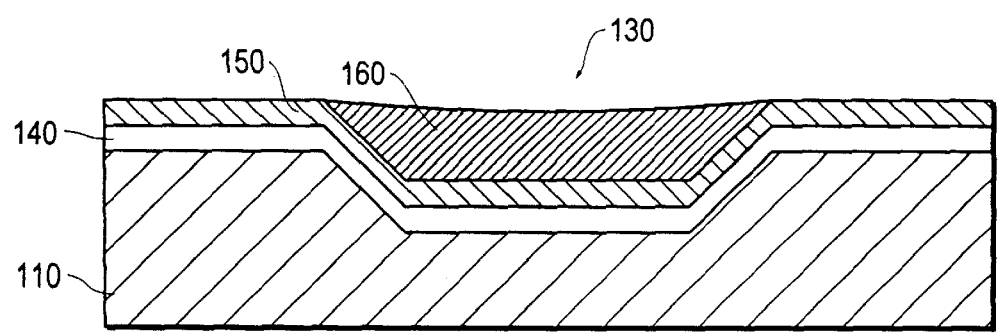
Figure 13:
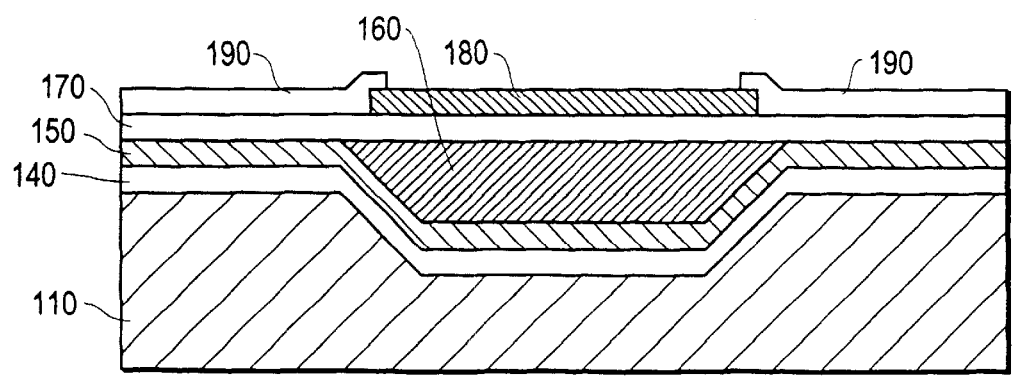

In FIGS. 11–13, the material 160 filling the vias 130 is metal rather than silicon dioxide. In FIG. 11, the wafer has been processed as shown in FIGS. 1–5. A metal ball 160 is placed by a robot into each via 130 using a method known in the art. Alternatively, metal 160 is deposited by electrodeposition. Before the electrodeposition process, the wafer face side is masked by a dielectric mask (not shown).

The mask is made of photoresist in some embodiments. An opening is made in the mask in the area of each via 130. Then electrodeposition is performed to deposit metal 160 into the vias through the openings. The mask is then removed. Other methods to deposit metal 160 are used in other embodiments.

Metal 160 has a higher melting temperature than solder 210 (FIG. 9) that will be used to make contacts between the dice. However, metal 160 has a lower melting temperature than layer 150. Suitable metals include tin (melting temperature 232° C.), zinc (melting temperature 420° C.), and their alloys. In some embodiments that use aluminum for interconnects, the metal 160 melting temperature does not exceed 600° C. (the aluminum melting temperature is 660° C.).

In some embodiments, the volume of metal 160 in each via 130 is less than the volume of the via so that when the metal 160 melts, it will not overflow its via.

The wafer is heated to melt the metal 160 (FIG. 12) without melting the layer 150. In FIG. 12, the top surface of the metal filling 160 is coplanar with, or below, the top surface of metal 150 outside the via. In some embodiments, metal 160 overflows the vias and spreads over the top surface of the wafer outside the vias.

Then any other circuit elements can be formed over the via surface as shown in FIG. 13. In particular, in some embodiments, metal layer 150 is patterned to form conductive lines as described above for the embodiment of FIG. 6. When the metal 150 is etched, any overlaying metal 160 that may have overflowed the vias 130 is etched at the same time.

Dielectric 170 (e.g. BPSG), last metal 180 (e.g. Al/Si) providing the face-side contact pads, and dielectric 190 (e.g. BPSG; see FIG. 13) are deposited and photolithographically patterned similarly to the embodiment of FIG. 7. In some embodiments, metal 180 is aluminum deposit by vacuum sputtering or thermal evaporation. The wafer temperature during deposition does not exceed 250–300° C. The wafer temperature does not exceed the melting temperature of metal 160.

The wafer is thinned as described above in connection with FIG. 8A. In some embodiments, dielectric 192 is deposited as described above in connection with FIG. 8B. In other embodiments, dielectric 192 is omitted. Then fabrication proceeds as shown above in FIGS. 9 and 10. All the processing steps of FIGS. 8A, 8B, 9, 10, including melting or softening the solder 210, are performed at temperatures below the melting temperature of metal 160.

Metal 160 increases the mechanical strength of the integrated circuit. Metal 160 also improves heat dissipation when local heating occurs.

Figure 14:
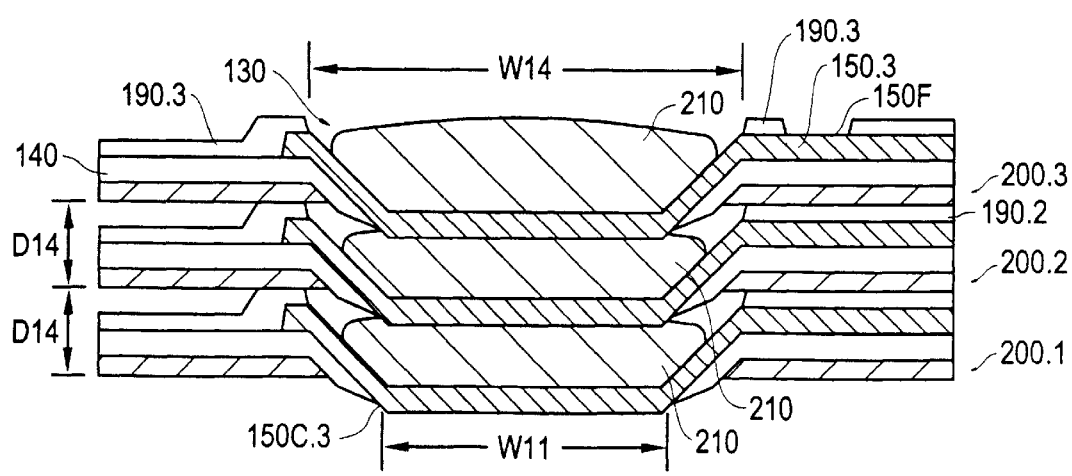
FIGS. 14 and 15 each show three dice connected in a vertical integrated circuit.

In FIG. 14, fillings 160 are omitted. After fabrication of the structure of FIG. 5, dielectric 190 (BPSG in some embodiments) is deposited directly on conductive layer 150. Dielectric 190 is removed in vias 130 by a masked etch. The etch also removes dielectric 190 from other selected areas of metal 150, such as area 150F, to form face-side contact pads away from vias 130.

The wafers are diced into dice. Solder balls 210 of a diameter larger than the depth of vias 130 are placed in the vias. Solder is also placed over those face-side contact pads 150F which are to be connected to back-side contact pads 150C of overlying dice. Solder 210 in vias 130 is sufficiently thick so that when the solder is melted or softened, the top surface of the solder is at about the same height as the top surface of solder portions (not shown) over contacts 150F. The dice 200 are aligned, pressed together, and heated, as described above in connection with FIGS. 9–10. The solder melts or softens and creates contacts between adjacent dice.

In some embodiments, layer 190 of each die except the top die contacts silicon substrate 110 or dielectric 192 (if present) of the adjacent overlying die. Adhesive is omitted in some embodiments since friction between layers 190 and silicon 110 or dielectric 192 creates sufficient resistance to shearing forces.

The width W14 of each via 130 at the top is 90–150 $\mu$m in some embodiments. The width W11 of each back-side contact pad 150C is 30–50 $\mu$m. The distance D14 between similar points on the adjacent dice, for example, between bottom surfaces of substrates 110 of the adjacent dice, is 30–50 $\mu$m.

Figure 15:
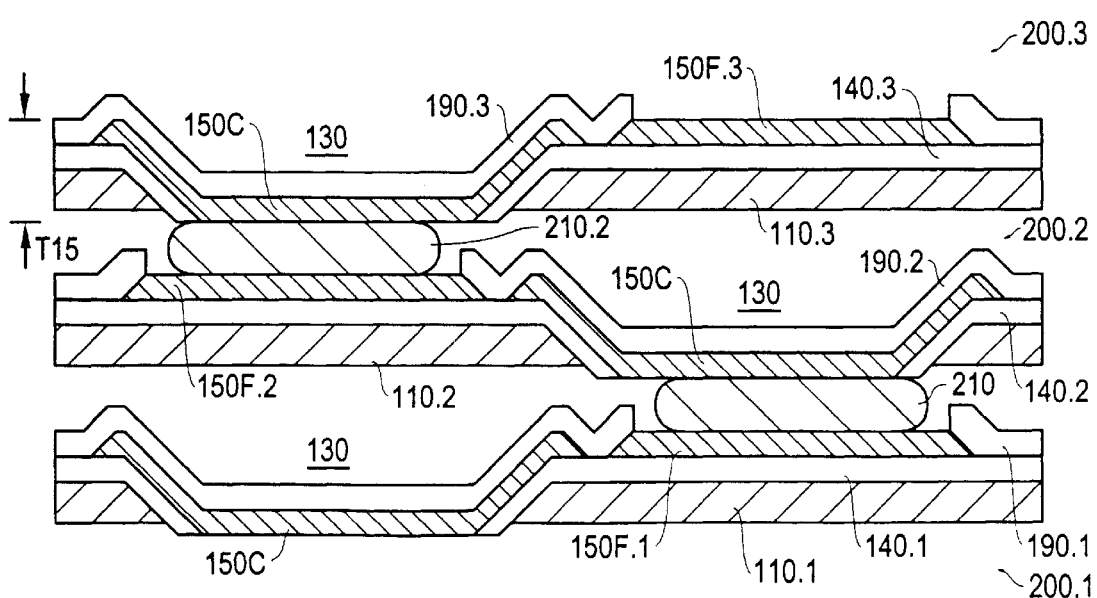

In FIG. 15, face-side contact pads do not overlie vias 130. Face-side contact pads 150F are made outside vias 130. Pads 150F are made from Al/Si layer 150 as described above in FIG. 14, or from another metal layer. Fillings 160 are omitted in some embodiments, but are present in other embodiments. Solder balls 210 are placed in openings in BPSG 190 over contact pads 150F. The dice are aligned to position the back-side contact pads 150C over corresponding face-side contact pads 150F. The dice are heated and pressed together as described above in connection with FIGS. 9, 10 and 14. Solder 210 forms contacts between the contact pads. Adhesive (not shown) is introduced in spaces between the dice as described above in connection with FIGS. 9 and 10. Dielectric 192 (FIG. 8B) is present in some embodiments of FIG. 15 but not in other embodiments.

In some embodiments, the die thickness T15 measured from the top surface of dielectric 190 to the bottom surface of back-side contact pads 150C is 25 $\mu$m. Other thicknesses are used in other embodiments.

FIG. 16 illustrates the back-side plasma processing that includes the etch exposing the contact pads 150C and (optionally) the deposition of dielectric 192. The processing is performed at atmospheric pressure in an etcher described above in connection with FIG. 8A. During the etch and deposition, the wafer 104 is held in a non-contact wafer holder 1610. The wafer face side is oriented towards the holder 1610. Holder 1610 holds the wafer from the top without physically contacting the wafer. See also the USSR inventor certificate 732198 of inventors A. F. Andreev and R. A. Luus, published May 8, 1980, and incorporated herein by reference. Circular gas flow (vortex) 1614 between wafer holder 1610 and wafer 104 holds the wafer up close to the holder, but does not allow the wafer to contact the holder. Hence, a protective layer is not needed to protect circuitry 1618 on the wafer face side from physical contact with the holder or from being etched or otherwise damaged by plasma jet 1624. Plasma jet generator 1620 moves horizontally so that the plasma jet 1624 generated by the generator scans the wafer back side 104B.

Figure 17A:
FIGS. 17 and 18 illustrate thinning of individual dice.
Figure 17B:
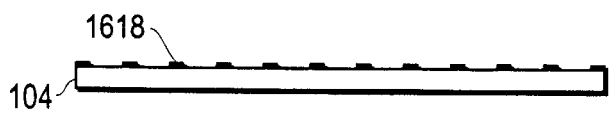
Figure 17C:
Figure 17D:
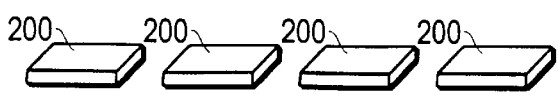
Figure 18:
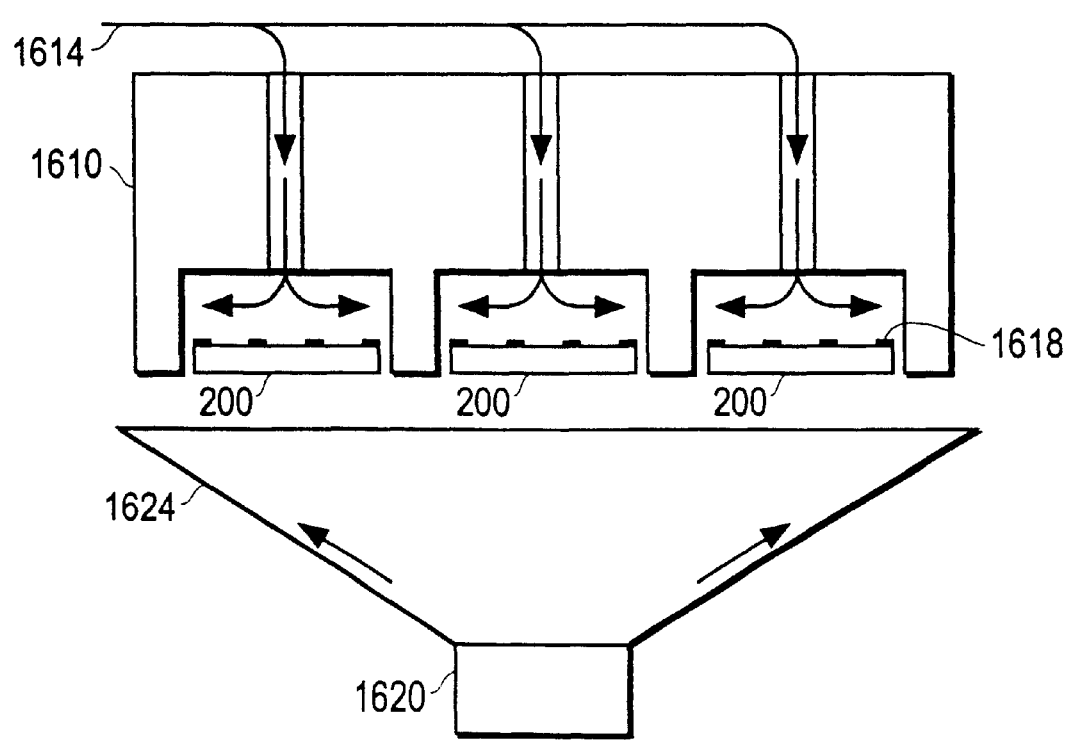

FIGS. 17–18 show an alternate atmospheric-pressure process suitable for thinning the wafer. FIG. 17 consists of FIGS. 17A–17D. FIG. 17A illustrates the wafer 104 right before the thinning process. Circuitry 1618 has been fabricated on the wafer face side. In some embodiments, the wafer thickness is 600–720 $\mu$m. Silicon is removed from the wafer back side by known methods (e.g. mechanical grinding) to reduce the wafer thickness to 150–350 $\mu$m. The resulting wafer is shown in FIG. 17B. The wafer is diced into chips 200 (FIG. 17C). The thickness of each chip is 150–350 $\mu$m. The chips are tested and sorted as known in the art. The chips are thinned further by fluorine-containing plasma at atmospheric pressure, and (optionally) dielectric 192 is deposited on the back side immediately after the etch as shown in FIG. 18. The etcher and the process of FIG. 18 are similar to those of FIG. 16, but in FIG. 18 the non-contact chip holder 1610 holds several individual chips (3 chips in FIG. 18) rather than a wafer. Each chip 200 is placed in an individual segment of holder 1610 and is held in place by gas flow 1614 similarly to FIG. 16. The plasma jet 1624 scans all the chips from the back side until the dielectric 140 at the via bottoms is removed and (optionally) dielectric 192 is deposited. No protective layer for circuitry 1618 is needed.

The atmospheric-pressure backside etch of the chips reduces the chip thickness to below 50 $\mu$m (FIG. 17D).

Chips 200 can be stack packaged as described above in connection with FIGS. 10, 14, 15.

The two-stage process of FIG. 17 (e.g. mechanical grounding followed by plasma processing) reduces manufacturing costs in some embodiments. Indeed, depending on the manufacturing yield, the area of the wafer occupied by "bad" dice together with unused regions may be considerable, for example, 50% of the wafer. If the wafer is diced before the thinning is completed as in the process of FIG. 17, and only "good" dice are thinned to completion and (optionally) provided with dielectric 192, time and resources are saved in thinning and deposition as compared to thinning the whole wafer and depositing dielectric 192 over the whole wafer. Further, a wafer of a 6–8 inch diameter, thinned down to 50 $\mu$m, is more fragile than a die having the same thickness but smaller lateral dimensions (below 1 inch in some embodiments). This is another reason why the manufacturing costs in some embodiments of FIG. 17 are lower.

In some embodiments, the processes of FIGS. 16, 17 and 18 are used to thin wafers or dice that are not used in vertical integrated circuits. In such embodiments, the back side etches may or may not expose any conductive contacts. The processes of FIGS. 16–18 follow fabrication of one or more circuit elements in or over the face side of each die or wafer. Therefore, the circuit element fabrication is performed when the wafer is thicker than its final thickness and, therefore, is mechanically stronger.

The embodiments described above illustrate but do not limit the invention. In particular, the invention is not limited by the number of dice in a vertical integrated circuit (the number of dice can be any number greater than one), or by any particular thicknesses, opening widths, or other dimensions. The invention is not limited by any particular materials. Non-silicon wafers are used in some embodiments.

What is claimed is:

1. A method for manufacturing a vertical integrated circuit, the method comprising:

(1) manufacturing a plurality of individual integrated circuits, wherein manufacturing of at least one of the individual integrated circuits comprises:
   manufacturing an integrated circuits in a wafer;
   separating the integrated circuit from the wafer;
   performing a back side etch of the integrated circuit separated from the wafer to thin the integrated circuit as the integrated circuit is held in a non-contact wafer holder;
(2) after the manufacture of the individual integrated circuits has been completed, and each individual integrated circuit has been manufactured to its final thickness, attaching the individual integrated circuits to each other to form a vertical integrated circuit.

2. A method for integrated circuit fabrication, the method comprising:
   fabricating a plurality of integrated circuits from a semiconductor wafer;
   dicing the wafer into dice; and
   thinning one or more dice which were obtained from the wafer in said dicing as the one or more dice are held in a non-contact holder.

3. The method of claim 2 wherein fabricating a plurality of integrated circuits comprises fabricating one or more circuit elements in or over a first side of the wafer, wherein each die has a first side located at the first side of the wafer; and
   wherein during the thinning process, the first side of each of the one or more dice faces the non-contact holder which protects one or more of the circuit elements fabricated in or over the first sides of the one or more dice from being etched.

4. The method of claim 2 wherein the etching process comprises a fluorine containing plasma etch at atmospheric pressure.

5. The method of claim 2 wherein the wafer comprises silicon.

6. The method of claim 2 wherein the thinning of the one or more dice is preceded by testing of the integrated circuits, and the thinning is performed only on a die or dice that have passed the test.

7. The method of claim 2 wherein manufacturing each of the individual integrated circuits comprises:
   manufacturing an integrated circuit in a wafer;
   separating the integrated circuit from the wafer;
   performing a back side etch of the integrated circuit separated from the wafer to thin the integrated circuit as the integrated circuit is held in a non-contact wafer holder.

* * * * *